United States Patent
Arunachalam et al.

(10) Patent No.: US 7,309,984 B2
(45) Date of Patent: Dec. 18, 2007

(54) PARALLEL MAGNETIC RESONANCE IMAGING METHOD USING A RADIAL ACQUISITION TRAJECTORY

(75) Inventors: Arjun Arunachalam, Madison, WI (US); Alexey A. Samsonov, Madison, WI (US); Walter Francis Block, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/259,804

(22) Filed: Oct. 27, 2005

(65) Prior Publication Data

US 2007/0096733 A1 May 3, 2007

(51) Int. Cl.
*G01V 3/00* (2006.01)

(52) U.S. Cl. ........................ 324/307; 324/309
(58) Field of Classification Search ............... 324/309, 324/307
See application file for complete search history.

(56) References Cited

U.S. PATENT DOCUMENTS

| | | | |
|---|---|---|---|
| 6,630,828 B1 | 10/2003 | Mistretta et al. | |
| 6,784,664 B2 * | 8/2004 | Liang et al. | 324/309 |
| 6,841,998 B1 * | 1/2005 | Griswold | 324/309 |
| 6,900,631 B2 | 5/2005 | Bydder et al. | |
| 6,903,551 B2 | 6/2005 | Madore | |
| 7,002,344 B2 | 2/2006 | Griswold et al. | |
| 2003/0164702 A1 | 9/2003 | Wang | |
| 2005/0100202 A1* | 5/2005 | Huang | 382/128 |
| 2005/0187458 A1 | 8/2005 | Kannengiesser et al. | |
| 2006/0028206 A1* | 2/2006 | Zhang et al. | 324/309 |
| 2006/0184000 A1* | 8/2006 | Wang et al. | 600/410 |

OTHER PUBLICATIONS

A. Arunachalam, Grappa for the 3D Radial Trajectory (VIPR); Proc. Intl. Soc. Mag. Reson. Med. 13 (2005).
M.A. Griswold; Rapid Evaluation of Cardiac Function Using Undersampled Radial TrueFISP with GRAPPA; Proc. Intl. Soc. Mag. Reson. Med.
Ernest N. Yeh, et al; Inherently Self-Calibrating Non-Cartesian Parallel Imaging; Mag. Reson. in Med. 54:1-8 (2005).
M. A. Griswold et al; Generalized Autocalibrating Partially Parallel Acquisitions (GRAPPA); Mag. Reson. in Med. 47:1201-1210 (2002).

* cited by examiner

*Primary Examiner*—Brij Shrivastav
*Assistant Examiner*—Megann E Vaughn
(74) *Attorney, Agent, or Firm*—Quarles & Brady, LLP

(57) ABSTRACT

A method for reconstructing an image from undersampled, parallel MRI data sets acquired with a pulse sequence that samples k-space along radial trajectories includes the synthesis of training k-space data from the acquired data. The training k-space data is produced by reconstructing training images from the fully sampled, central k-space region of the acquired MRI data sets, and the training k-space data is used in a radial GRAPPA image reconstruction method to produce an image frame.

13 Claims, 5 Drawing Sheets

PARALLEL MAGNETIC RESONANCE IMAGING METHOD USING A RADIAL ACQUISITION TRAJECTORY

STATEMENT REGARDING FEDERALLY SPONSORED RESEARCH

This invention was made with government support under Grant No. EB002075 awarded by the National Institute of Health. The United States Government has certain rights in this invention.

BACKGROUND OF THE INVENTION

The field of the invention is magnetic resonance imaging and more particularly parallel imaging methods using a plurality of acquisition coils.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The most commonly used technique, which is frequently referred to as "spin-warp" or "Fourier imaging" employs a pulse sequence that samples Fourier space, or "k-space" in Cartesian coordinates. This technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. In a 3D FT scan a second phase encoding gradient ($G_z$) is also employed, and it too is stepped through a sequence of views for each value of the first phase encoding gradient ($G_y$).

Most NMR scans currently used to produce medical images require many minutes to acquire the necessary data. The reduction of this scan time is an important consideration, since reduced scan increases patient throughput, improves patient comfort, and improves image quality by reducing motion artifacts. There are many different strategies being used to shorten the scan time and the present invention relates to two of these.

As disclosed in U.S. Pat. No. 6,630,828 entitled "Rapid Acquisition Magnetic Resonance Imaging Using Radial Projections" and U.S. Pat. No. 6,487,435 entitled "Magnetic Resonance Angiography Using Undersampled 3D Projection Imaging", k-space can be sampled with radial trajectories rather than rectilinear trajectories as is done with spin-warp methods that employ phase encoding. This is illustrated for 2D imaging in FIGS. 2 and 3, where FIG. 2 illustrates the conventional rectilinear sampling of k-space where a $G_y$ phase encoding is employed and FIG. 3 illustrates radial k-space sampling where the sampling trajectories all pass through the center of k-space and extend radially outward therefrom. The advantage of the latter method is that the image artifacts that are produced (when fewer views are acquired and k-space is not fully sampled according to the Nyquist criteria) are not as troubling to a diagnostician as the artifacts produced when a rectilinear method undersamples to the same extent. In other words, scan time can be reduced more by undersampling with a radial k-space sampling pattern than with the more conventional rectilinear sampling pattern.

A second technique that is used to shorten scan time is referred to generally as a "parallel imaging technique". Such "pMRI" techniques use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

Parallel imaging techniques fall into one of two categories. They can fill in the omitted k-space lines prior to Fourier transformation, by constructing a weighted combination of neighboring lines acquired by the different RF detector coils. Or, they can first Fourier transform the undersampled k-space data set to produce an aliased image from each coil, and then unfold the aliased signals by a linear transformation of the superimposed pixel values. In either case, the reconstructed images tend to suffer from incomplete removal of aliasing artifacts, especially for large speedup factors. In images corrupted by aliasing, the edges of the image are wrapped into the center of the image.

Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving coils, with each coils having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used as explained by Pruessmann et al., Magnetic Resonance in Medicine Vol. 42, p. 952-962, 1999.

For pulse sequences that execute a rectilinear trajectory in k-space, parallel imaging techniques invariably reduce the number of phase encoding steps in order to reduce imaging time, and then use the coil sensitivity information to make up for the loss of spatial information.

As explained above, undersampled non-Cartesian acquisitions such as spirals and radial sampling can acquire high resolution images quickly in such applications as real-time cardiac imaging and time-resolved contrast-enhanced MRA. Applying parallel imaging techniques could reduce further the undersampling artifacts to allow even shorter scan times than are currently available. However, in a non-Cartesian acquisition, a pixel may alias throughout a significant portion of the image volume and thus unaliasing the pixels using a pMRI technique is a different and more difficult task.

The SENSE technique has been applied to non-Cartesian trajectories by Pruessmann K P, Weiger M, Scheidegger M B, Boesiger P., "Advances In Sensitivity Encoding With Arbitrary K-Space Trajectories," Magn Reson Med, 2001; 46: 638-651; and Kannengiesser S A R, Brenner A R, Noll T G. "Accelerated Image Reconstruction For Sensitivity Encoded Imaging With Arbitrary K-Space Trajectories." Proceedings of the 8th Annual Meeting of ISMRM, Denver, 2000, p 155. Here the solution to an intractable matrix inversion is required and this is accomplished by iteratively using the Conjugate Gradient method. Though processing is tractable using this method, the processing becomes especially demanding for 3D imaging applications, and real-time applications are currently infeasible.

An important advance to efficient pMRI processing with non-Cartesian trajectories is a technique known as radial GRAPPA introduced by Griswold M A, Heidemann R M, Jakob P M., "Direct Parallel Imaging Reconstruction Of Radially Sampled Data Using GRAPPA With Relative Shifts.," Proceedings of the ISMRM $11^{th}$ Scientific Meeting, Toronto, 2003: 2349. Original Generalized Autocalibrating Partially Parallel Acquisition (GRAPPA) determines a linear combination of individual coil data to create missing lines of k-space. The method determines the coefficients for the combination by fitting the acquired data to some oversampled data near the center of k-space.

With radial GRAPPA a preliminary scan is first performed to acquire "training data" that is used to estimate the missing radial data. This training data can then be used throughout a real-time scan to estimate unsampled radial lines with little processing. Using a large coil array, cardiac imaging with image quality equivalent to acquiring 96 radial sample trajectories per frame was achieved by acquiring as few as eight radial sample trajectories per frame. These techniques have also been successfully adapted to 3D radial sampling. However, radial GRAPPA requires the acquisition of high quality fully sampled training data, which often requires extensive signal averaging. Such a lengthy acquisition may be impractical in contrast enhanced dynamic studies.

SUMMARY OF THE INVENTION

The present invention is a method for producing an image from a plurality of parallel acquired and undersampled k-space data sets without the need for acquiring a separate, fully sampled training k-space data set. More specifically, the undersampled k-space data sets are acquired using a pulse sequence that samples k-space along radial trajectories, low resolution images are produced from the central regions of the undersampled k-space data sets, and training images are produced from the low resolution images and used to produce fully sampled training k-space data sets.

A general object of the invention is to enable radial GRAPPA to be employed to produce an image from a set of parallel acquired undersampled k-space data sets without the need for the acquisition of a separate training k-space data set. Training k-space data is synthesized from the acquired undersampled k-space data sets by recognizing that artifact free training images can be reconstructed from the more densely sampled central region of k-space in radial MRI acquisitions.

Another object of the invention is to improve the images produced during a CEMRA study using the radial GRAPPA method. Rather than using a single training image acquired prior to injection of the contrast agent, a series of training images are synthesized as the study progresses. As a result, the synthesized training images more accurately reflect the changes that occur due to contrast enhancement during the study, as do the reconstructed image frames.

DETAILED DESCRIPTION OF THE PREFERRED EMBODIMENT

Figure 1:
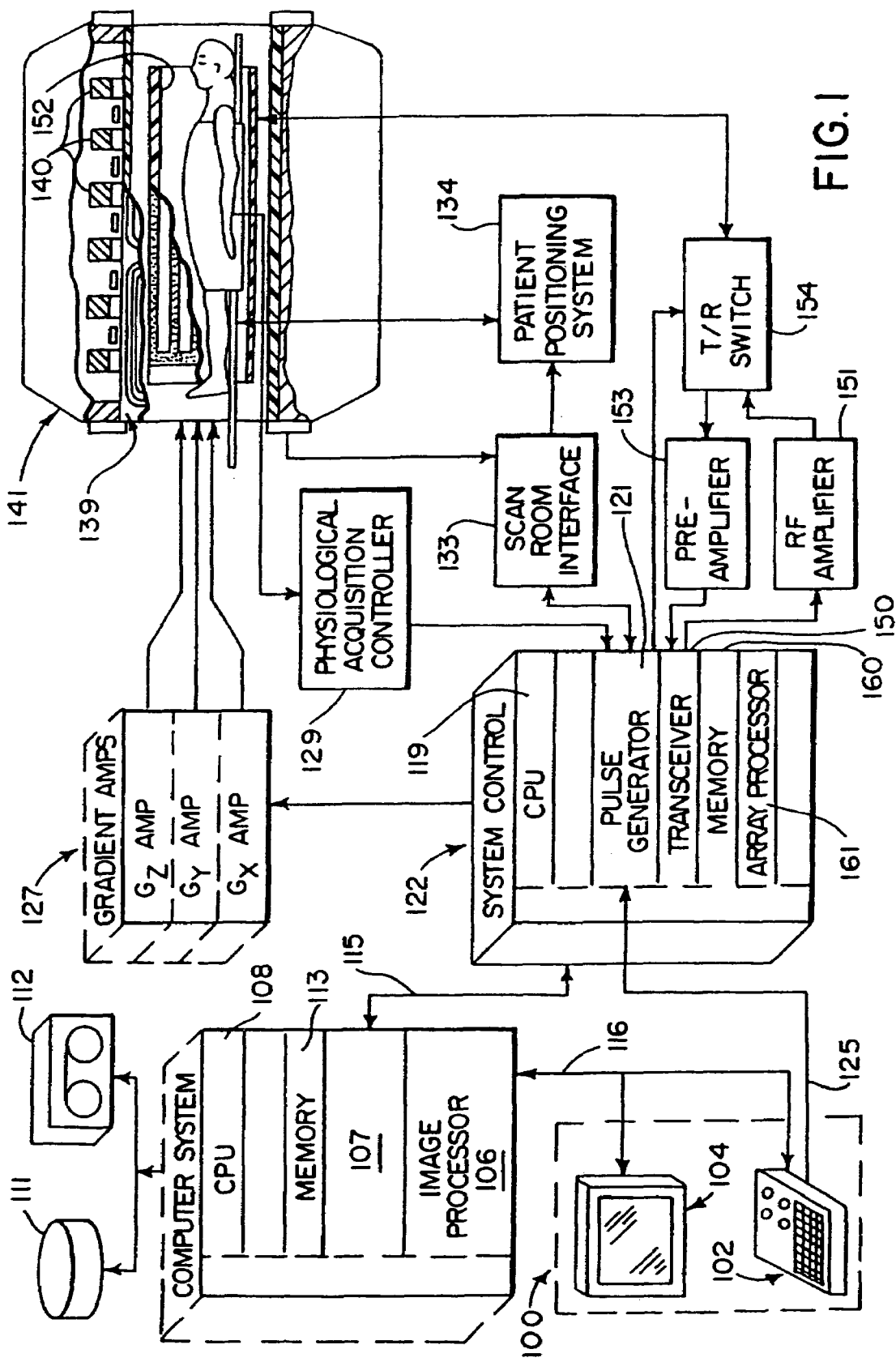
FIG. 1 is a block diagram of an MRI system employed to practice the present invention.
Figure 2:
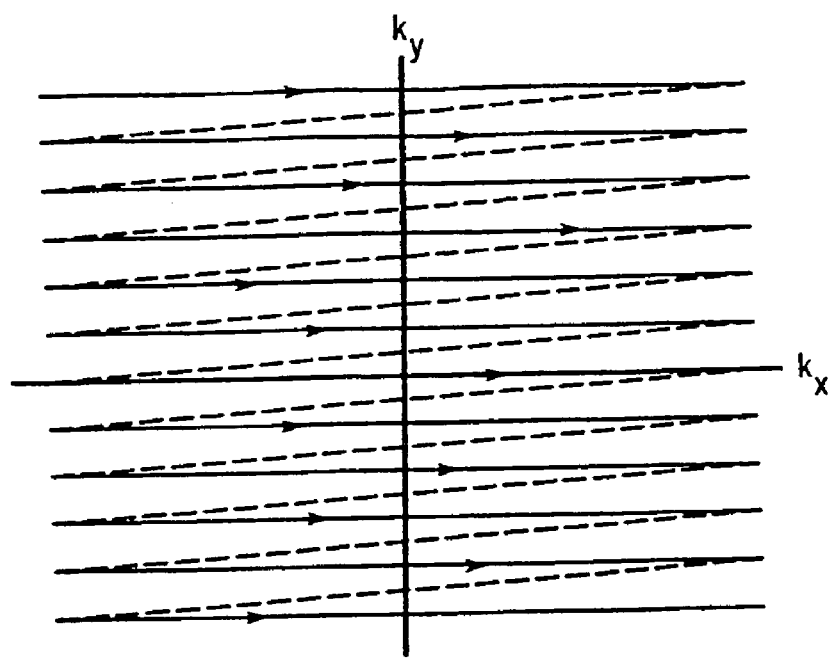
FIG. 2 is a graphic representation of a rectilinear k-space sampling pattern which produces k-space samples on a Cartesian grid.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of Gx, Gy and Gz amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient are typically sensed by the same RF coil 152 and coupled through the transmit/receive switch 154 to a preamplifier 153, however, in the preferred embodiment a multiple coil array designed for pMRI use is employed. As described in U.S. Pat. No. 6,876,199 for example, such PMRI coil arrays are comprised of a set of local coils designed to have a receptivity field centered over a particular portion of the anatomy being image. The amplified NMR signals produced by each local coil in the array are demodulated, filtered, and digitized by a separate receive channel in the receiver section of the transceiver 150 such that a plurality (N) k-space data sets are acquired in parallel.

The NMR signals picked up by each RF local coil are digitized by the transceiver module 150 and transferred to a memory module 160 in the system control 122. When the scan is completed and an entire array of data has been acquired in the memory module 160, an array processor 161 is employed according to the teachings of the present invention to transform, or reconstruct, the acquired k-space data sets into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 3:
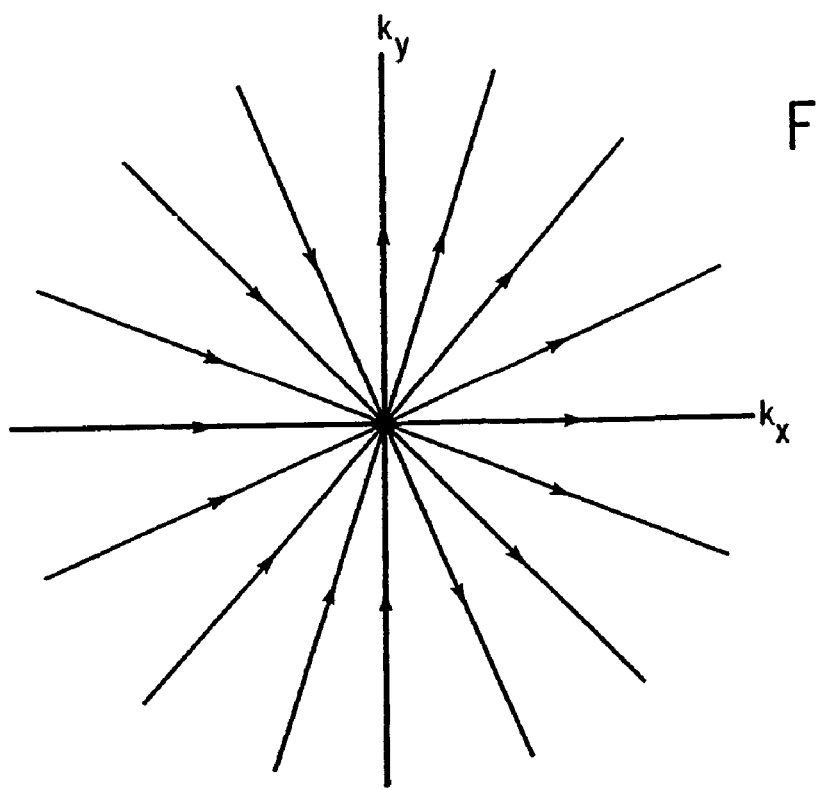
FIG. 3 is a graphic representation of a radial k-space sampling pattern which produces k-space samples in radial projections.

When the pulse generator module 121 is programmed to perform a 2D radial acquisition as described, for example, in U.S. Pat. No. 6,630,828, or a 3D radial acquisition as described for example, in U.S. Pat. No. 6,487,435, the digitized NMR signals from each local coil in the coil array sample k-space with radial trajectories as illustrated in FIG. 3. Each repetition of the pulse sequence samples another radial trajectory to increase the sampling density. While the increased sampling density reduces artifacts caused by undersampling k-space, the corresponding increase in pulse sequence repetitions lengthens the total scan time. As will now be described in detail, the present invention enables the information in the highly undersampled k-space data sets produced by the separate local coils to be combined to produce a more fully sampled k-space data set for each coil. An image with reduced artifacts can thus be reconstructed from these more fully sampled coil k-space data sets without increasing scan time.

Figure 4:
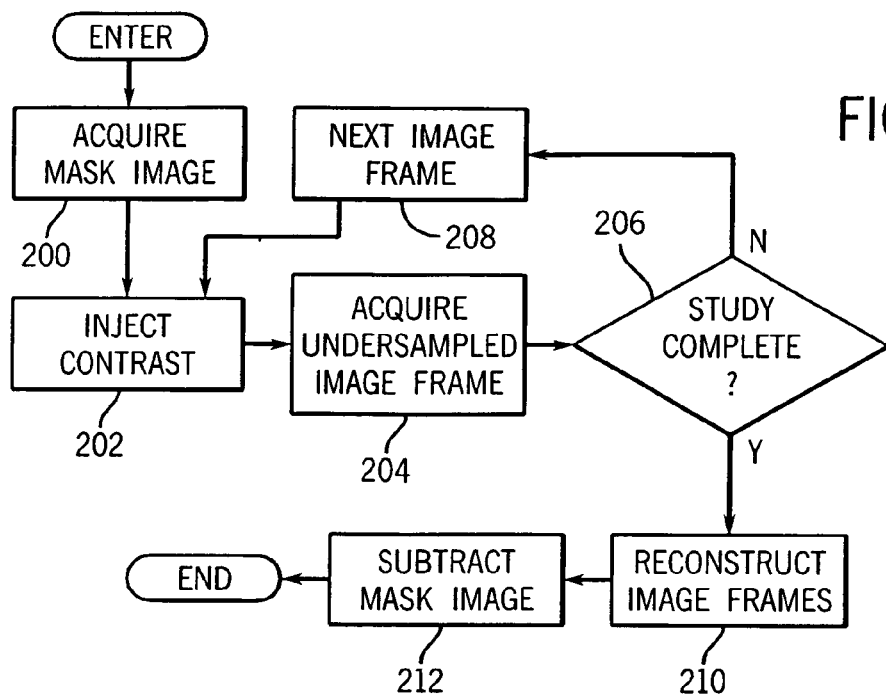
FIG. 4 is a flow chart of a CEMRA dynamic study performed with the MRI system of FIG. 1 in which the present invention is employed.

While the present invention may be employed in a number of different clinical applications, the preferred embodiment of the invention is shown herein used in a CEMRA dynamic study in which a series of image frames are acquired during the uptake of a contrast agent. Referring particularly to FIG. 4, the first step in such a CEMRA study is to acquire a mask image as indicated at process block 200. Since time resolution is not a factor, this is a fully sampled k-space acquisition using the pulse sequence of choice and a conventional image reconstruction. The contrast agent is then injected at process block 202 and a loop is then entered in which a series of frame images are acquired at a high temporal rate while the contrast agent flows into the region of interest (ROI). More specifically, an undersampled image frame is acquired using a 2D or 3D radial pulse sequence. Whereas a typical 2D radial acquisition might acquire _____ radial views to produce a clinical acceptable image, by using the present invention with N=_____ separate coils, only _____ radial views need be acquired to produce an image of comparable clinical quality. Since N separate coils are employed, there are N separate, undersampled k-space data sets for each image frame.

Image frames are acquired as indicated at process block 208 until the study is complete as determined at decision block 206. The study may be terminated manually, or it may be terminated automatically at a specified time after peak arterial contrast enhancement has occurred.

After the data acquisition phase of the study is completed, each of the acquired image frames is processed as indicated at process block 210 to reconstruct an image as will be described in detail below with respect to FIG. 5. The mask image is subtracted from each reconstructed frame image as indicated at process block 212 to remove stationary tissues and produce the series of MRA images that depict the inflow of contrast agent into the ROI.

The method used to reconstruct a frame image from a plurality of undersampled k-space data sets acquired in parallel with a plurality of receive coils will now be described. While this method is described in the context of a CEMRA study, it should be apparent that the method may be used in other clinical applications. Also, other pulse sequences which sample radially directed patterns may be used. For example, spiral or curved sampling patterns which pass through the center of k-space and more densely sample the center of k-space may be used.

Figure 5A:
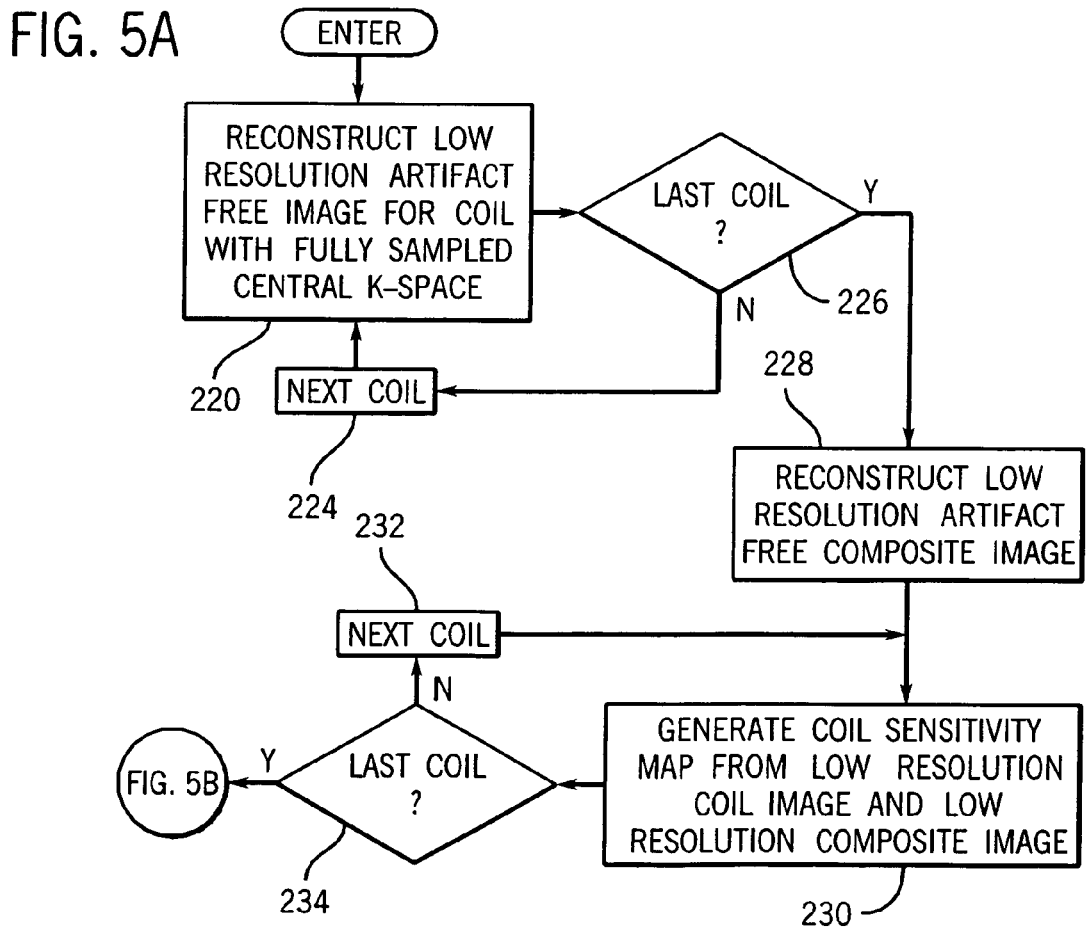
FIGS. 5A-C is a flow chart of the method used to reconstruct image frames which forms part of the study of FIG. 4.
Figure 6:
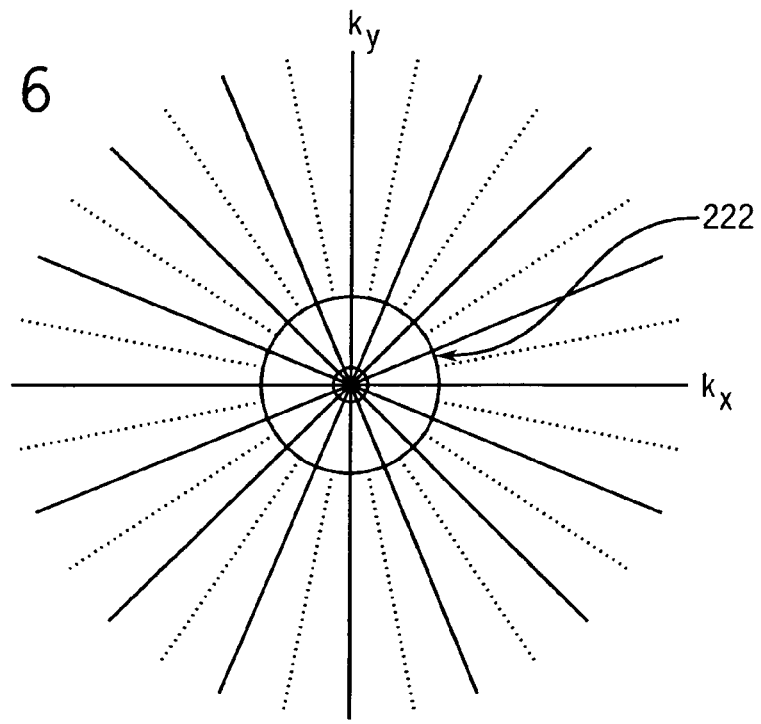
FIG. 6 is a graphic illustration of the acquired and synthesized k-space data in one exemplary embodiment of the invention.

Referring particularly to FIG. 5A, the first step in the method as indicated by process block 220 is to reconstruct an image from the central k-space region of the undersampled k-space data set acquired by each coil. Such a k-space data set is depicted in FIG. 6, where the solid radial lines indicate the acquired k-space data, the dotted radial lines indicate the k-space data that will be computed using the present invention and the circle 222 indicates the central k-space region. The central k-space region 222 is that region where k-space is sampled with sufficient density to avoid producing significant artifacts in the reconstructed image. In the preferred embodiment the radius of this central k-space region 222 is equal to the number of acquired radial projections divided by $\pi=3.14$. A conventional image reconstruction is performed on this limited data set and includes regridding the radial samples to a Cartesian coordinate system and then performing a 2D or 3D Fourier transformation on the regridded data set. As indicated at process block 224, this is repeated for each coil until low resolution images ($I_{L1-LN}$) have been reconstructed for all N coils as indicated at decision block 226.

As indicated at process block 228, the next step is to produce a low resolution composite image ($I_{COMP_L}$) by combining the N separate low resolution coil images. The combination is a conventional sum-of-squares computation of corresponding values in each low resolution coil image;

$$I_{COMP_L} = \sqrt{I_{L1}^2 + I_{L2}^2 \ldots I_{LN}^2}. \tag{1}$$

A loop is then entered in which a coil sensitivity map $I_{SM}$ is calculated for each coil 1 through N as indicated at process block 230. For coil n this is computed by dividing the low resolution coil image by the low resolution composite image as follows:

$$I_{sm_n} = I_{Ln}/I_{COMP_L}.$$

This is repeated for each coil as indicated at process block 232, and when completed as indicated at decision block 234, images which indicate the receptivity sensitivity of all N coils are stored. These sensitivity maps may be filtered as needed to smoothen them for more accuracy.

Figure 5B:
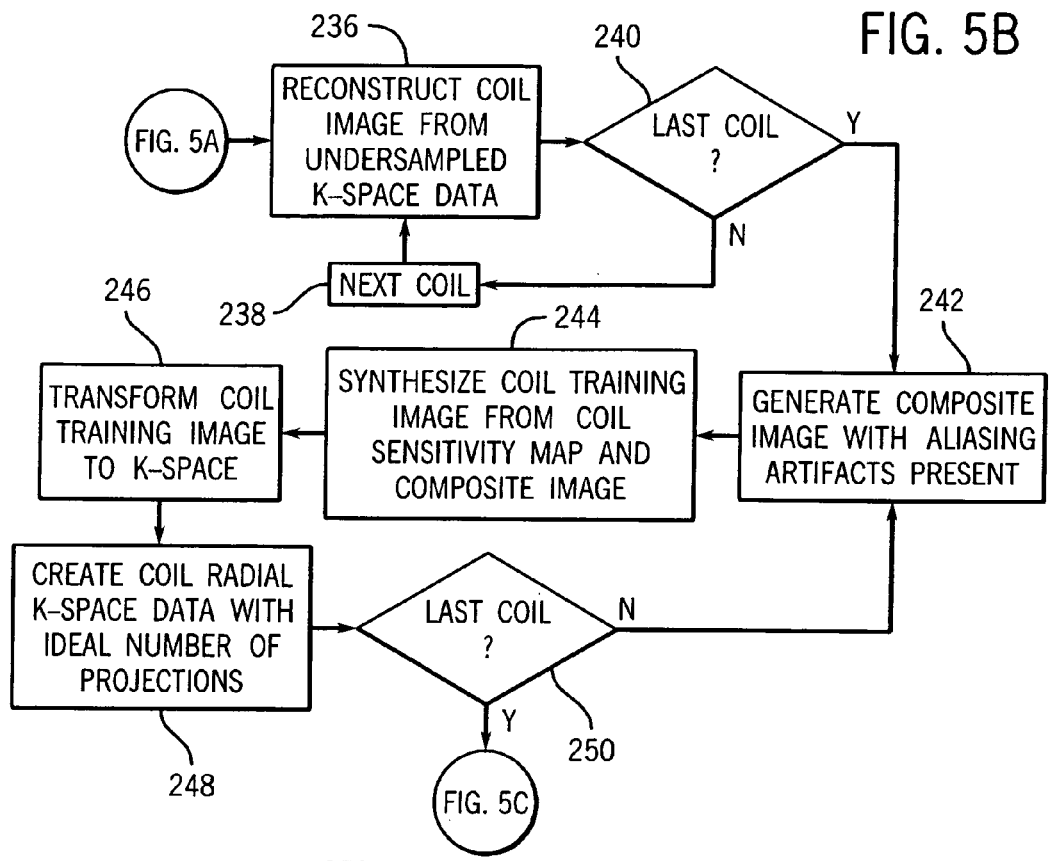

Referring particularly to FIG. 5B, the next step is to reconstruct coil images $I_{C1-CN}$ from the acquired undersampled k-space data sets as indicated at process block 236. This reconstruction is performed in the same manner as described above for the low resolution images $I_{L1-LN}$ except all the acquired k-space data is regridded and Fourier transformed. Because k-space is under sampled outside the central region 222 (FIG. 6), streak artifacts will be produced in these coil images. Coil images $I_C$ are reconstructed as indicated at process block 238 until all the coil images have been produced as determined at decision block 240. As indicated at process block 242, a composite image is then produced by combining the separate coil images using the sum-of-squares method:

$$I_{COMP} = \sqrt{I_{C1}^2 + I_{C2}^2 + \ldots I_{CN}^2}. \tag{2}$$

As indicated at process block 244, a coil training image $I_T$ is calculated next by multiplying the composite image $I_{COMP}$ by the coil's sensitivity map $I_{SM}$. For coil n this is expressed as $$I_{T_n} = I_{COMP} * I_{SM_N}. \tag{3}$$

As indicated at process block 246, the coil training image $I_T$ is then Fourier transformed to k-space and regridded to produce radial k-space data with the desired number of radial projections as indicated at process block 248. Referring to FIG. 6, for example, whereas the original k-space acquisition included only the projections indicated by solid radial lines, the regridding step 248 may also produce k-space samples along the projections indicated by the interleaved dotted radial lines. Thus, if 64 projection views were acquired during the scan for one image frame, for example, 128 projection views are produced by this regridding step 248. A fully sampled, radial training k-space data set $K_T$ is thus produced for each of N coils as determined at decision block 250.

Figure 5C:
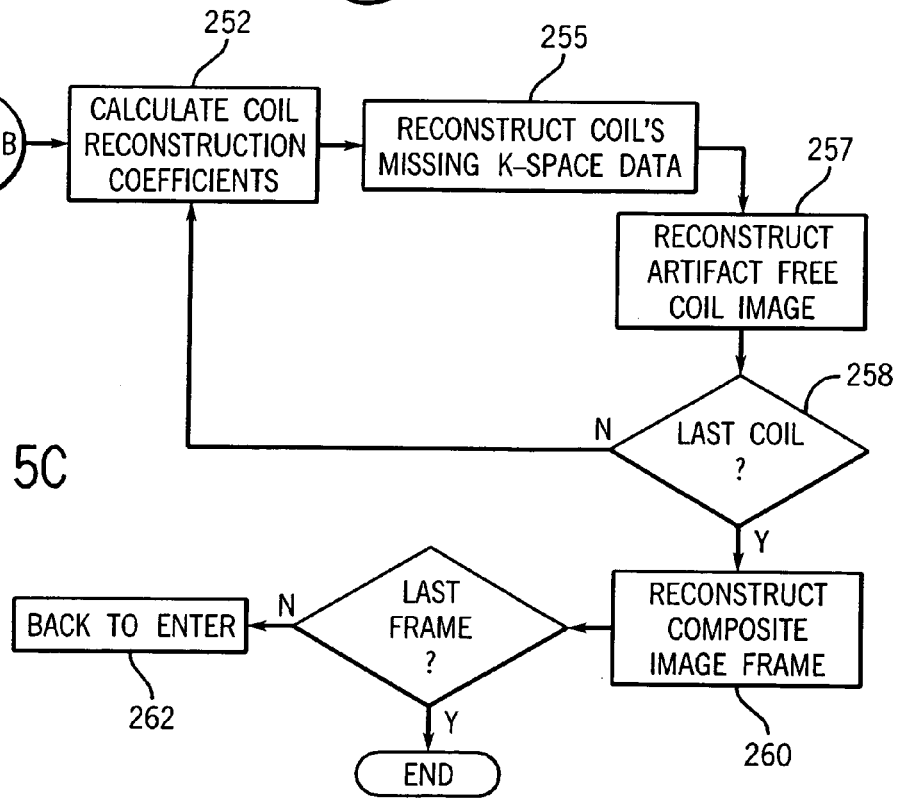
Figure 7:
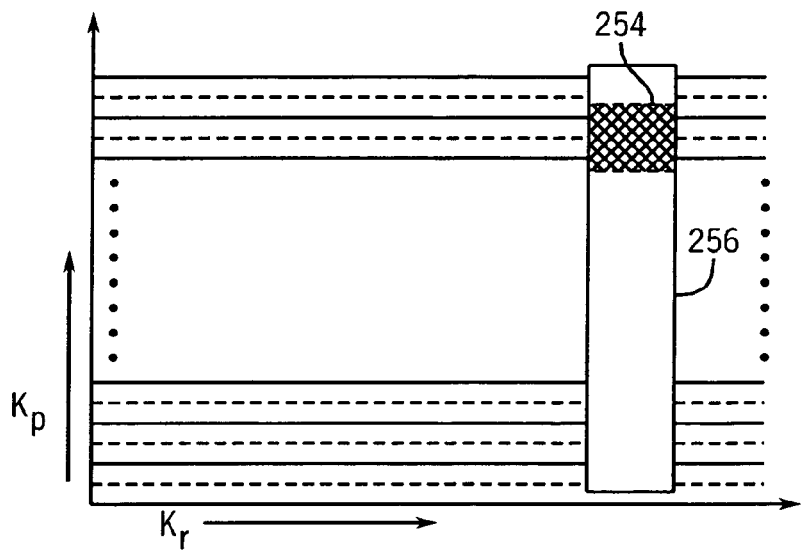
FIG. 7 is a pictorial representation of processing steps in the method of FIG. 5.

Referring particularly to FIG. 5C, the remainder of the procedure is a modification of the radial GRAPPA method discussed above. A loop is entered in which an image is reconstructed for each coil in three steps. The first step indicated by process block 252 is to calculate a set of reconstruction coefficients for this coil. These coefficients are computed from the training k-space data set $K_T$ as follows. First, the training k-space data is a set of radial trajectories as shown in FIG. 6, where the solid radial lines corresponds with acquired k-space data and the dotted radial lines corresponds with k-space data that needs to be calculated. This data set can be rearranged as shown in FIG. 7, where the successive radial sampling trajectories are parallel to each other such that the vertical axis is the azimuthal dimension $K_p$ of the trajectory and the horizontal axis is the radial dimension $K_r$. The solid lines represent acquired k-space data and the interleaved dotted lines represent k-space data that is to be calculated. It is at each k-space location on the dotted lines that must be calculated and it is for each of these k-space locations that reconstruction coefficients are calculated. This is done step-by-step using the following formula:

$$W = K_T * A^{h} * (AA^h) \tag{4}$$

where W is an array of reconstruction coefficients for a k-space location in a local region indicated by cross hatched area 254, $K_T$ is an array of training k-space data for unacquired k-space locations in the region 254 and A is an array of training k-space data for acquired k-space locations in the region 254. This calculation is made and then the region 254 is moved vertically along the strip 256 creating a set of reconstruction coefficients for each new local region 254 such that eventually reconstruction coefficients are produced for all unsampled k-space locations in the strip 256. The strip is then shifted horizontally along the $K_r$ axis and the process is repeated until reconstruction coefficients are computed for all unacquired k-space locations indicated by the dotted lines in FIG. 7.

Figure 8:
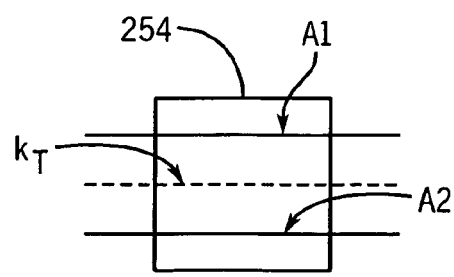
FIG. 8 is a pictorial representation of a local region that illustrates part of the steps depicted in FIG. 7.

To better understand how the reconstruction coefficients are calculated in the local region 254, reference is made to FIG. 8 where A1 and A2 are two lines of training k-space data which together form the two-dimensional array A and $K_T$ is the line of computed training k-space data located therebetween. If the local region is, for example, 16 k-space sample points in the horizontal, or radial direction, then the equation for the reconstruction coefficients W takes the following form for each receiver coil:

$$[\cdots K_T \cdots] = [W1 \quad W2] * \begin{bmatrix} \cdots A1 \cdots \\ \cdots A2 \cdots \end{bmatrix} \tag{5}$$

or $$K_T = W * A.$$

and $$W = K_T * A^h * (AA^h)$$

In order to reliably reconstruct the missing k-space data the array A not only includes acquired data for this coil, but also for the corresponding acquired k-space data from the other receiver coils. If there are four receiver coils, for example, there are eight reconstruction coefficients and eight lines of training k-space data in array A:

$$[\cdots K_T \cdots] = [W1 - W8] * \begin{bmatrix} \cdots A1 \cdots \\ \vdots \\ \cdots A8 \cdots \end{bmatrix} \tag{6}$$

Referring again to FIG. 5C, after all the reconstruction coefficients W are calculated the missing k-space data $K_m$ for the receive coil is calculated as indicated at process block 255. This calculation is done using a formula having the same form as equation (6):

$$[\cdots K_m \cdots] = [W1 - W8] * \begin{bmatrix} \cdots A'_1 \cdots \\ \vdots \\ \cdots A'_8 \cdots \end{bmatrix} \quad (7)$$

where W1-W8 are the reconstructed coefficients for this particular k-space local region 254 (FIG. 7) and A'$_1$-A'$_8$ are lines of acquired k-space samples from the adjacent line n the undersampled k-space data sets.

After the missing k-space data is calculated the complete k-space data set is used to reconstruct an artifact free image (I) for the coil as indicated at process block 257. This image reconstruction employs the regridding and Fourier transformation method described above and when all the receiver coil images (I$_1$-I$_N$) have been reconstructed as determined at decision block 258, a frame image (I$_f$) is produced as indicated at process block 260. This is a sum-of-squares combination of the coil images as follows:

$$I_f = \sqrt{I_1^2 + I_2^2 ... I_N^2}.$$

Additional frame images If are produced as determined at decision block until the process is terminated.

The invention claimed is:

1. A method for producing an image with a magnetic resonance imaging (MRI) system, the steps comprising:
   a) acquiring in parallel a plurality of undersampled k-space data sets with the MRI system using a pulse sequence that samples k-space along radial trajectories that sample through the origin of k-space;
   b) reconstructing a corresponding plurality of low resolution images from a more densely sampled central region of each of said undersampled k-space data sets;
   c) producing a corresponding plurality of coil sensitivity maps from the respective low resolution images;
   d) producing a corresponding plurality of coil training images from the respective coil sensitivity maps;
   e) reconstruct a plurality of coil images using the respective coil training images and the respective undersampled k-space data sets; and
   f) producing an image by combining the plurality of coil images.

2. The method as recited in claim 1 in which step c) includes:
   c)i) producing a low resolution composite image by combining the plurality of low resolution images; and
   c)ii) dividing each low resolution image by the composite low resolution image to produce the corresponding coil sensitivity maps.

3. The method as recited in claim 1 in which step d) includes:
   d)i) reconstructing a corresponding plurality of coil images from the plurality of undersampled k-space data sets;
   d)ii) producing a composite image by combining the plurality of coil images; and
   d)iii) multiplying each coil sensitivity map by the composite image to produce the corresponding plurality of coil training images.

4. The method as recited in claim 1 in which step e) includes:
   e)i) calculating a corresponding plurality of sets of reconstruction coefficients using the plurality of coil training images; and
   e)ii) producing the corresponding plurality of coil images.

5. The method as recited in claim 4 in which step e)i) includes transforming each coil training image to k-space prior to calculating the reconstruction coefficients.

6. The method as recited in claim 5 in which step e)ii) includes:
   calculating k-space sample data using the reconstruction coefficients and k-space samples in the corresponding undersampled k-space data set;
   combining the calculated k-space sample data with the corresponding undersampled k-space data set; and
   reconstructing the coil image using the combined k-space data.

7. A method for producing a series of images of a subject with a magnetic resonance imaging (MRI) system after the injection of a contrast agent into the subject, the steps comprising:
   a) acquiring in parallel a plurality of undersampled k-space data sets with the MRI system using a pulse sequence that samples k-space along radial trajectories that sample through the origin of k-space;
   b) producing a corresponding plurality of coil training images from the respective undersampled k-space data sets;
   c) reconstruct a plurality of coil images using the respective coil training images and the respective undersampled k-space data sets;
   d) producing an image by combining the plurality of coil images; and
   e) repeating steps a) through d) a plurality of times to produce a corresponding plurality of images that depict the inflow of contrast agent into the subject.

8. The method as recited in claim 7 in which step b) includes:
   b)i) reconstructing a corresponding plurality of low resolution images from a more densely sampled central region of each of said undersampled k-space data sets;
   b)ii) producing a corresponding plurality of coil sensitivity maps from the respective low resolution images; and
   b)iii) producing the corresponding plurality of training images from the respective coil sensitivity maps.

9. The method as recited in claim 8 in which step b)ii) includes:
   producing a low resolution composite image by combining the plurality of low resolution images; and
   dividing each low resolution image by the composite low resolution image to produce the corresponding coil sensitivity maps.

10. The method as recited in claim 7 in which step c) includes:
    calculating a corresponding plurality of sets of reconstruction coefficients using the plurality of coil training images; and
    producing the corresponding plurality of coil images.

11. The method as recited in claim 10 which includes transforming each coil training image to k-space prior to calculating the reconstruction coefficients.

12. The method as recited in claim 11 which includes:
    calculating k-space sample data using the reconstruction coefficients and k-space samples in the corresponding undersampled k-space data set;
    combining the calculated k-space sample data with the corresponding undersampled k-space data set; and
    reconstructing the coil image using the combined k-space data.

13. The method as recited in claim 7 in which step c) employs a radial GRAPPA reconstruction method.

* * * * *